(12) United States Patent
Mizutani et al.

(10) Patent No.: US 6,802,926 B2
(45) Date of Patent: Oct. 12, 2004

(54) METHOD OF PRODUCING SEMICONDUCTOR THIN FILM AND METHOD OF PRODUCING SOLAR CELL USING SAME

(75) Inventors: Masaki Mizutani, Isehara (JP); Isao Tanikawa, Hiratsuka (JP); Katsumi Nakagawa, Atsugi (JP); Tatsumi Shoji, Hiratsuka (JP); Noritaka Ukiyo, Atsugi (JP); Yukiko Iwasaki, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/813,137

(22) Filed: Mar. 21, 2001

(65) Prior Publication Data

US 2001/0018949 A1 Sep. 6, 2001

Related U.S. Application Data

(62) Division of application No. 09/333,019, filed on Jun. 15, 1999, now Pat. No. 6,258,666.

(30) Foreign Application Priority Data

Jun. 18, 1998 (JP) .......................................... 10-171403
Jun. 7, 1999 (JP) .......................................... 11-159374

(51) Int. Cl.$^7$ ............................................. B32B 31/00
(52) U.S. Cl. ...................... 156/247; 156/344; 156/584; 438/455; 438/458
(58) Field of Search ................................ 156/241, 247, 156/249, 344, 584; 438/406, 409, 455, 457, 458, 459, 960; 136/243, 261; 117/915

(56) References Cited

U.S. PATENT DOCUMENTS 3,040,489 A  6/1962  Da Costa ........................ 53/21
3,396,452 A  8/1968  Sato et al. ...................... 29/413
3,497,948 A  3/1970  Wiesler et al. ................. 29/583
3,562,057 A  2/1971  McAlister et al. ........... 156/300
4,108,343 A  8/1978  Vossen ........................... 225/1
4,303,463 A  * 12/1981  Cook ......................... 438/501
4,447,289 A  5/1984  Geissler et al. .............. 156/608
4,867,836 A  9/1989  Hamamura et al. .......... 156/584

(List continued on next page.)

FOREIGN PATENT DOCUMENTS

| EP | 0 212 597 | 3/1987 |
|----|-----------|--------|
| EP | 0 849 788 | 6/1998 |
| JP | 7-302889  | 11/1995 |
| JP | 8-213645  | 8/1996 |

OTHER PUBLICATIONS

Patent Abstracts of Japan, vol. 096, No. 003, Mar. 1996 (corresponds to JP 7–302889).

(List continued on next page.)

Primary Examiner—Jeff H. Aftergut
Assistant Examiner—John L. Goff
(74) Attorney, Agent, or Firm—Fitzpatrick, Cella, Harper & Scinto

(57) ABSTRACT

A method of producing a semiconductor thin film is provided. While a semiconductor thin film formed on a substrate is supported on a curved surface of a support member having the curved surface, the support member is rotated, thereby peeling the semiconductor thin film away from the substrate. Also provided is a method of producing a semiconductor thin film having the step of peeling a semiconductor thin film formed on a substrate away from the substrate, wherein the peeling step is carried out after the substrate is secured on a substrate support member without an adhesive. According to these methods, it is possible to peel the semiconductor thin film away from the substrate without damage and to hold the substrate without contamination.

5 Claims, 7 Drawing Sheets

U.S. PATENT DOCUMENTS

| | | | |
|---|---|---|---|
| 4,904,610 A | | 2/1990 | Shyr ............................ 437/15 |
| 5,006,190 A | | 4/1991 | Earle ........................... 156/247 |
| 5,009,735 A | | 4/1991 | Ametani et al. ............. 156/241 |
| 5,183,529 A | | 2/1993 | Potter et al. ................. 156/613 |
| 5,306,647 A | | 4/1994 | Lehmann et al. ............... 437/2 |
| 5,397,713 A | * | 3/1995 | Hamamoto et al. ........... 438/97 |
| 5,811,348 A | | 9/1998 | Matsushita et al. ......... 438/455 |
| 5,856,229 A | | 1/1999 | Sakaguchi et al. .......... 438/406 |
| 5,861,077 A | | 1/1999 | Kamijo et al. ............... 156/344 |
| 6,100,166 A | * | 8/2000 | Sakaguchi et al. .......... 438/455 |
| 6,120,597 A | | 9/2000 | Levy et al. ..................... 117/3 |
| 6,258,666 B1 | * | 7/2001 | Mizutani et al. ............ 438/258 |

OTHER PUBLICATIONS

Patent Abstracts of Japan, vol. 096, No. 012, Dec. 1996 (corresponds to JP 8–213645).

Patent Abstracts of Japan, vol. 095, No. 002, Mar. 1995 (corresponds to JP 6–308739).

* cited by examiner

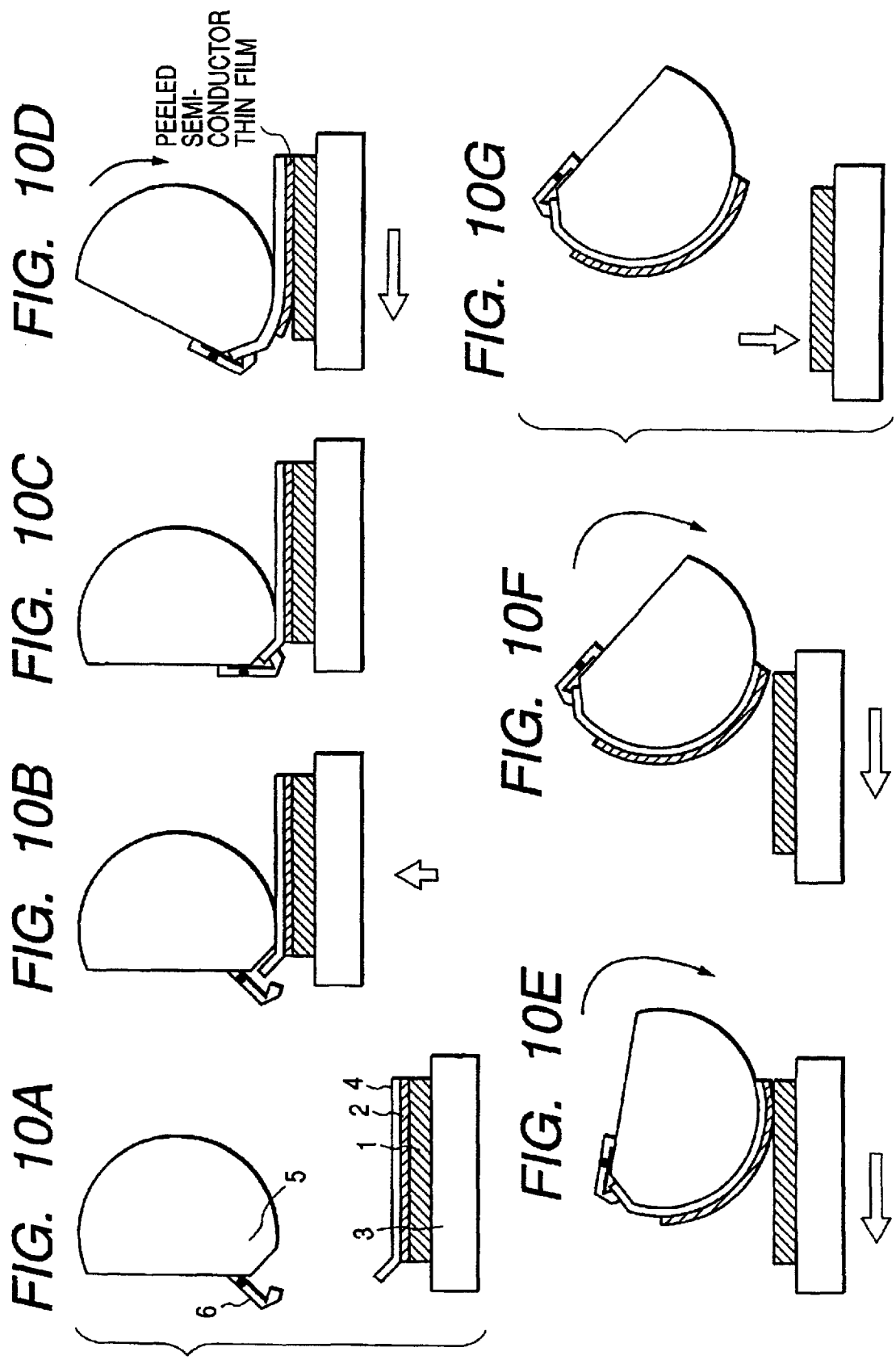

METHOD OF PRODUCING SEMICONDUCTOR THIN FILM AND METHOD OF PRODUCING SOLAR CELL USING SAME

This is a division of application Ser. No. 09/333,019 filed Jun. 15, 1999, now U.S. Pat. No. 6,258,666.

BACKGROUND OF THE INVENTION

1. Field of the Invention

The present invention relates to a method of producing a semiconductor thin film and, more particularly, to a method of peeling a semiconductor thin film and a method of producing a solar cell using the semiconductor thin film.

2. Related Background Art

There is the known technology of forming a semiconductor thin film through a peeling layer such as a porous layer or the like on a semiconductor substrate and thereafter peeling the semiconductor thin film away from the semiconductor substrate. Specific peeling methods include methods by etching and mechanical peeling methods with application of external force.

As an example of the latter, Japanese Patent Application Laid-Open No. 7-302889 (CANON K.K.) describes the technique of forming a porous layer on a surface of a first silicon wafer, thereafter forming an epitaxial silicon layer thereon, bonding a second silicon wafer to the epitaxial silicon layer, further bonding plates to the respective silicon wafers, and then separating the plates from each other, thereby peeling the epitaxial silicon layer away from the first silicon wafer.

Japanese Patent Application Laid-Open No. 8-213645 (SONY CORP.) describes the technology, similar to the above, of forming a porous layer on a surface of a single-crystal silicon substrate, thereafter epitaxially growing a pn junction (solar cell layers) thereon, bonding the back surface of the single-crystal silicon substrate to a jig with an adhesive on one hand, and also bonding another jig, for example, of metal, quartz, or the like to the side of the solar cell layers to be peeled off on the other hand, and thereafter separating the two jigs from each other, thereby peeling the solar cell layers away from the silicon substrate.

In the peeling of the semiconductor thin film or the solar cell layers according to the conventional techniques, each of the silicon substrate side and the side of the semiconductor thin film to be peeled off is supported by the rigid body or by the flat plate with low flexibility and thus the flat plates bonded are separated away from each other on the occasion of peeling. Therefore, considerable force is necessary for the peeling. This could result in damaging the semiconductor thin film expected to be utilized. In addition, the above techniques require a step of applying and curing the adhesive for securing the substrate to the plate or to the jig, which is the cause of decreasing productivity. Further, the adhesive remains on the back surface of the substrate and the above techniques thus necessitate a step of removing the adhesive in order to recycle the left substrate.

SUMMARY OF THE INVENTION

An object of the present invention is, therefore, to provide a peeling method for peeling the semiconductor thin film away from the substrate without damage in an easy way.

Another object of the present invention is to provide a method for holding the substrate without contamination.

The present invention provides a method of producing a semiconductor thin film comprising the step of rotating a support member having a curved surface while supporting a semiconductor thin film formed on a substrate, on the curved surface of the support member, thereby peeling the semiconductor thin film away from the substrate. According to this method, the semiconductor thin film can be peeled off the substrate in an easy way. At this time, it is preferable to increase the radius of curvature of the curved surface with progress of the peeling. The present invention also provides a method of producing a semiconductor thin film comprising the step of peeling a semiconductor thin film formed on a substrate away from the substrate, wherein magnitude of an external force for peeling the semiconductor thin film decreases with progress of the peeling.

Further, the present invention provides a method of producing a semiconductor thin film comprising the step of peeling a semiconductor thin film formed on a substrate away from the substrate, wherein the step of peeling is carried out after the substrate is secured on a substrate support member without an adhesive. According to this method, the substrate can be secured without contamination. The substrate is preferably held by vacuum suction, by electrostatic suction (adhesion), or by a securing claw.

The present invention also provides a method of producing a solar cell comprising the step of forming a separation layer on a substrate and forming a semiconductor thin film having a semiconductor layer of a first conductivity type and a semiconductor layer of a second conductivity type on the separation layer, the step of bonding a light-transmitting film onto the semiconductor thin film with a light-transmitting adhesive, the step of exerting an external force on the light-transmitting film to peel the semiconductor thin film away from the substrate, and the step of forming an electrode on a back surface of the semiconductor thin film thus peeled. Further, the present invention provides a method of producing a solar cell comprising the step of forming a separation layer on a substrate and forming a semiconductor thin film of a first conductivity type on the separation layer, the step of bonding a light-transmitting film onto the semiconductor thin film of the first conductivity type with a light-transmitting adhesive, the step of exerting an external force on the light-transmitting film to peel the semiconductor thin film of the first conductivity type away from the substrate, the step of forming a semiconductor thin film of a second conductivity type on a back surface of the first semiconductor thin film thus peeled, and the step of forming an electrode on the semiconductor thin film of the second conductivity type. According to the above methods, the solar cell can be produced through the simple steps.

BRIEF DESCRIPTION OF THE DRAWINGS

FIGS. 2A and 2B are schematic, perspective views to show examples of thin film support members applicable to the present invention, wherein FIG. 2A shows an example in which a part of the surface is a flat surface and FIG. 2B an example in which the radius of curvature varies;

FIGS. 3A and 3B are sectional views for explaining an example of peeling of the semiconductor thin film according to the present invention, wherein FIG. 3A shows a state upon start of the peeling and FIG. 3B a state during the peeling;

FIGS. 10A, 10B, 10C, 10D, 10E, 10F, and 10G are schematic, sectional views for explaining the peeling step in the method of producing the semiconductor thin film according to the present invention.

DETAILED DESCRIPTION OF THE PREFERRED EMBODIMENTS

Figure 1:
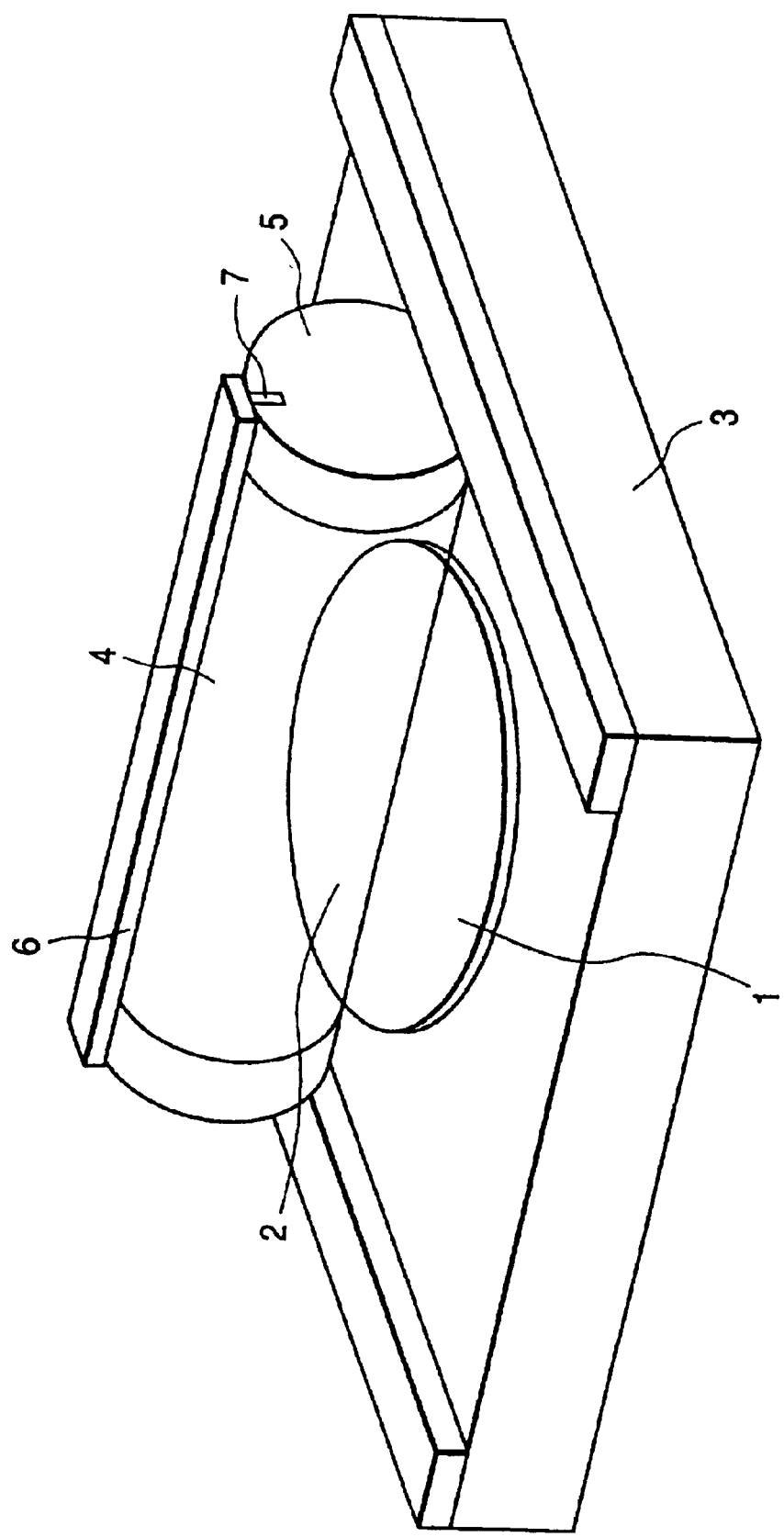
FIG. 1 is a perspective view to show an example of the method of producing the semiconductor thin film according to the present invention.

FIG. 1 is a perspective view to show an embodiment of the method of producing the semiconductor thin film according to the present invention, which shows an intermediate state of peeling. The procedures of peeling in the present embodiment will be described below with reference to FIG. 1.

(1) First, a separation layer is formed on a surface of substrate 1 and a semiconductor thin film 2 is formed on the separation layer. The separation layer can be a porous layer formed by anodization of a silicon substrate or a peeling layer formed by implanting $H^+$ (hydrogen ions) into the surface of the silicon substrate and annealing it. The separation layer can also be a graphite layer formed on the substrate of glass, metal, or the like. The substrate thus prepared is mounted and secured with the semiconductor thin film 2 up on a substrate support member 3 of a peeling device composed of the substrate support member 3 and a thin film support member 5, illustrated in FIG. 1, without use of an adhesive. A securing method suitably applicable can be either one of methods of close adhesion by use of physical force, specifically, by vacuum suction, electrostatic suction, mechanical holding with a securing claw or the like, or a combination of these. Use of these holding methods presents the advantage in that they do not affect the recycling of the substrate, because the substrate left after the peeling of the semiconductor thin film is not contaminated.

(2) A film 4 with flexibility is then bonded onto the surface of the semiconductor thin film. The film 4 prepared is one larger than the substrate 1, so that the film 4 extends outwardly from the substrate 1. When the film 4 used is an adhesive tape in which an adhesive is preliminarily placed on a film base, an application step and a curing step of the adhesive can be omitted, which improves the productivity remarkably. Therefore, use of the adhesive tape is preferable. In another applicable method the film 4 is mounted and secured after the adhesive is placed on the semiconductor thin film 2. Specific materials for the film 4 can be polyester, polycarbonate, polyvinyl chloride, ethylene-vinyl acetate copolymer, ethylene-ethylacrylate copolymer, polyethylene, polypropylene, ethylene-propylene copolymer, polyethylene terephthalate, ethylene-tetrafluoroethylene copolymer, and so on. Metal sheets such as of iron, copper, aluminum, and stainless steel can also be used. The adhesive for bonding the film 4 to the semiconductor thin film 2 can be one selected from acrylic resin, epoxy resin, silicone resin, fluororesin, and so on.

When the adhesive tape is used as the film 4, it is preferable to use the adhesive of a type that is cured by supply of activation energy, as the adhesive of the adhesive tape, because of its strong adhesive strength. The activation energy can be supplied by use of ultraviolet rays, infrared rays, electron beams, X-rays, or ultrasonic waves.

In cases where the film 4 is bonded after the adhesive is placed on the semiconductor thin film 2, it is preferable to use a resin with an excellent light-transmitting property, for example, such as ethylene-vinyl acetate copolymer (EVA), ethylene-ethylacrylate copolymer (EEA) or the like, in application of the thin film semiconductor 2 to the solar cell. An example of use of such thermoplastic or thermosetting resin is such that the adhesive resin formed in a sheet shape is mounted on the semiconductor thin film 2, the film 4 is mounted thereon, and the film 4 is pressed under heat and pressure to be bonded to the semiconductor thin film 2. The above procedures (1), (2) may also be carried out in the reverse order. Namely, the procedures may be arranged so that the film 4 is first bonded onto the semiconductor thin film 2 and thereafter the substrate 1 is secured on the substrate support member 3.

Figure 2A:
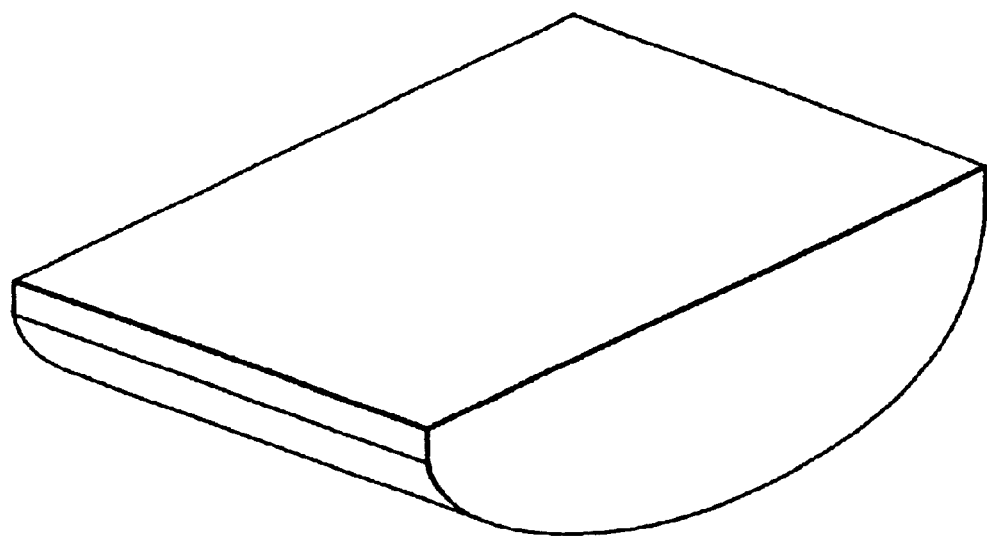
Figure 2B:
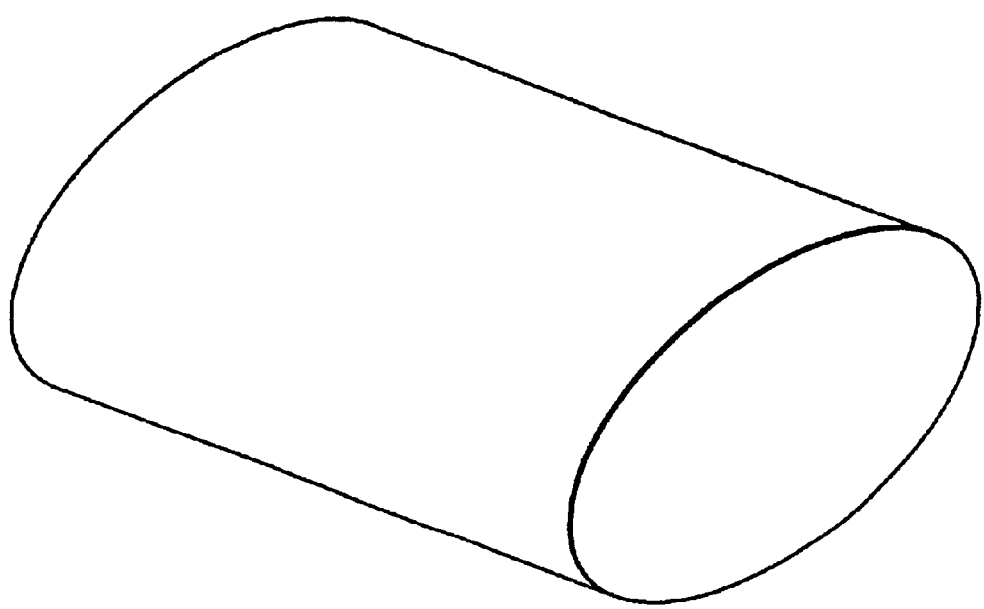
Figure 3A:
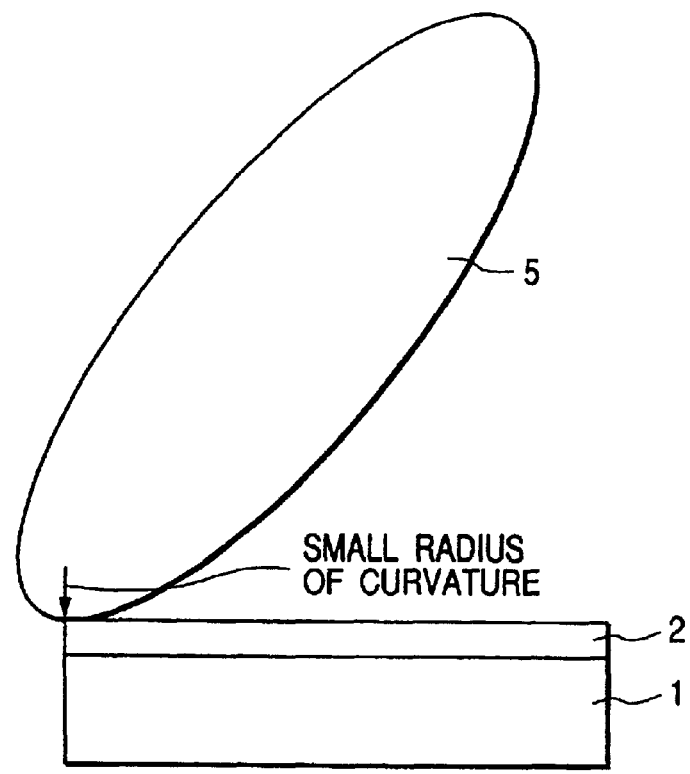
Figure 3B:
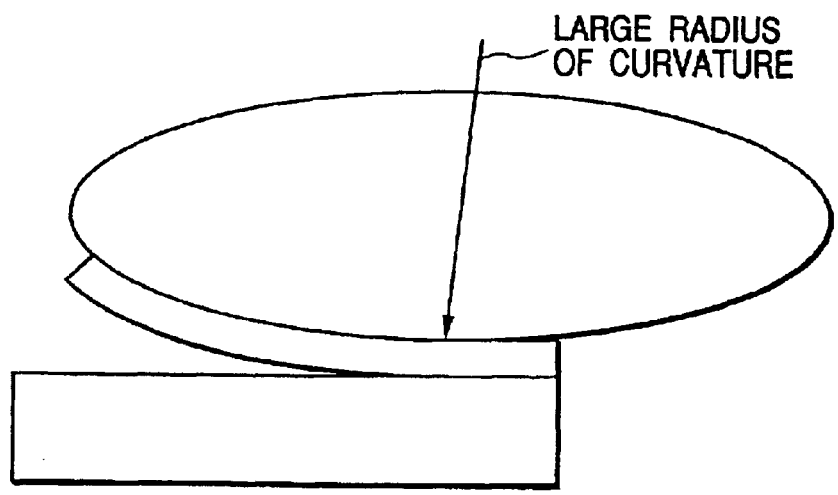

(3) The edge of the film 4 extending outwardly from the substrate 1 is secured on the thin film support member 5 having a curved surface. An example of the securing method is as follows; the edge of the film 4 is stuck into a groove 7 formed in the surface of the thin film support member 5 and thereafter the film 4 is pressed and secured by a film securing member 6 of a plate shape. The thin film support member 5 may be of a cylinder shape as illustrated in FIG. 1, but the curved surface does not always have to be circumferential, as illustrated in FIG. 2A. Since a relatively large peeling force is required at the start of peeling of the semiconductor thin film 2, it is preferable to employ such a shape of the curved surface as to have a small radius of curvature at a portion to contact the edge of the substrate at the start of peeling, as illustrated in FIG. 3A, and gradually increase the radius of curvature with progress of peeling, as illustrated in FIG. 3B. This can be realized, for example, by defining the lateral cross section in an elliptic shape as illustrated in FIG. 2B, a cycloidal curve, a catenary curve, or the like. Such shapes of the curved surface present the advantage in that sufficient peeling force is exhibited at the start of peeling and in that there is little damage to the semiconductor thin film in the central part thereof, because it is peeled off at the relatively large radius of curvature. Another method for obtaining the relatively large peeling force necessary at the start of peeling is a method of employing a relatively large peeling rate at the start of peeling and decreasing peeling rates with progress of peeling. Such control of peeling rates can be realized by varying rotating speed of the thin film support member 5.

(4) Then the thin film support member 5 is rotated, whereby the semiconductor thin film 2 is peeled off in the state as bonded to the film 4. During the rotation of the thin film support member 5, the support member 5 needs to rotate smoothly without a slip on the substrate support member 3. It is thus desirable to provide contact portions between the substrate support member 3 and the thin film support member 5 with slip preventing means. The slip preventing means can be selected from knurling, a rack and pinion gear mechanism, and so on. If the curved surface part of the thin film support member 5 is provided with an elastic member of rubber or the like, the damage to the semiconductor thin film 2 can be reduced and the thin film support member 5 can be prevented from slipping on the semiconductor thin film 2. A peeling assist force may also be applied between the substrate 1 and the semiconductor thin film 2 during the peeling. An application method of the peeling assist force can be selected from a method of mechanically forcing a wedge into between them, a method of applying a jet stream of a fluid, a method of supplying an electromagnetic wave, and so on. The semiconductor thin film produced according to the method of the present invention can be applied to solar cells, light-emitting diodes, field effect transistors, and so on.

[Peeling Step]

An example of the peeling step out of the series of production steps described above will be described referring to FIGS. 10A to 10G. FIGS. 10A to 10G are schematic, sectional views for explaining the example of the peeling step.

First, the film 4 is bonded onto the surface of the substrate 1 having the semiconductor thin film 2 with the separation layer (not illustrated) in between and this substrate 1 is secured on the substrate support member 3 by vacuum suction (FIG. 10A). The film 4 is bonded so that one end thereof is projecting outwardly from the substrate 1.

Next, the substrate support member 3 is moved up to bring the film 4 on the substrate 1 into contact with the thin film support member 5 (FIG. 10B).

Then the edge of the film 4 is pinched and secured by the film securing member 6 attached to the thin film support member 5 (FIG. 10C).

Next, as illustrated in FIG. 10D, the substrate support member 3 is moved to the left and the thin film support member 5 is also rotated in synchronism therewith, thereby starting the peeling operation. The substrate support member 3 and the thin film support member 5 are equipped with a rack and a pinion, respectively.

While the substrate support member 3 is moved further to the left, the thin film support member 5 is further rotated to carry on the peeling (FIG. 10E).

After the whole semiconductor thin film 2 is peeled off by the rotation of the thin film support member 5 (FIG. 10F), the substrate support member 3 is moved down (FIG. 10G).

[Method of Holding Substrate]

Figure 4:
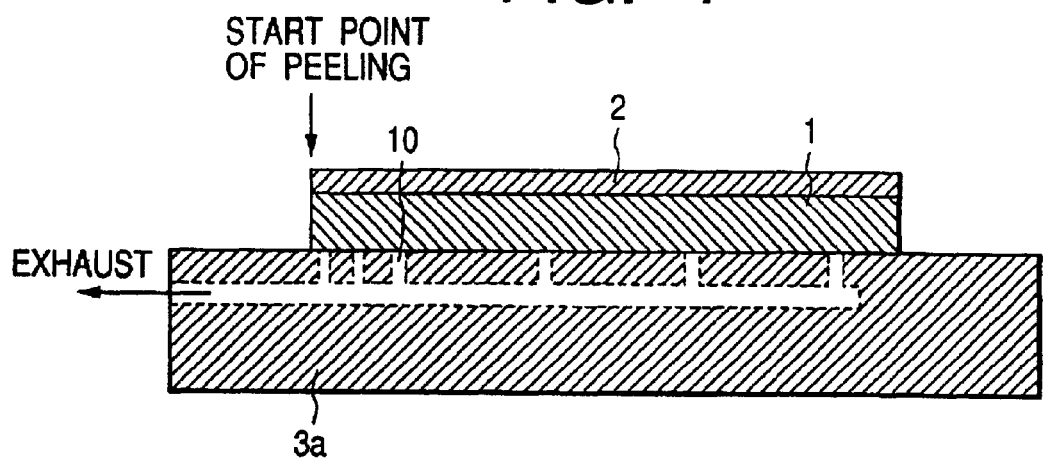
FIG. 4 is a schematic, sectional view to show an example of the substrate holding method by vacuum suction.

Next, an example of the holding (securing) of the substrate by vacuum suction will be described. FIG. 4 is a schematic, sectional view to show a state in which the substrate 1 is held on the substrate support member 3a by vacuum suction. In the same figure, the substrate support member 3a has vent holes 10 and the inside is evacuated through the vent holes 10 to create a vacuum to near vacuum state, thereby holding the substrate 1 on the substrate support member 3a. It is noted here that an elastic member may be interposed between the substrate 1 and the substrate support member 3a. This configuration allows the vacuum to be maintained even with slight bending of the substrate 1, and thus increases the strength of the vacuum suction to withstand the peeling force of the semiconductor thin film 2. The elastic member can be a silicone resin sheet having holes corresponding to the vent holes 10. The holding power for supporting and securing the substrate 1 may be controlled so as to be relatively large near the start point of peeling and decrease with distance from the start point of peeling. This control of the holding power can be implemented, for example, by providing the vent holes 10 in high density near the start point of peeling and decreasing the density of vent holes with distance from the start point of peeling.

Figure 5:
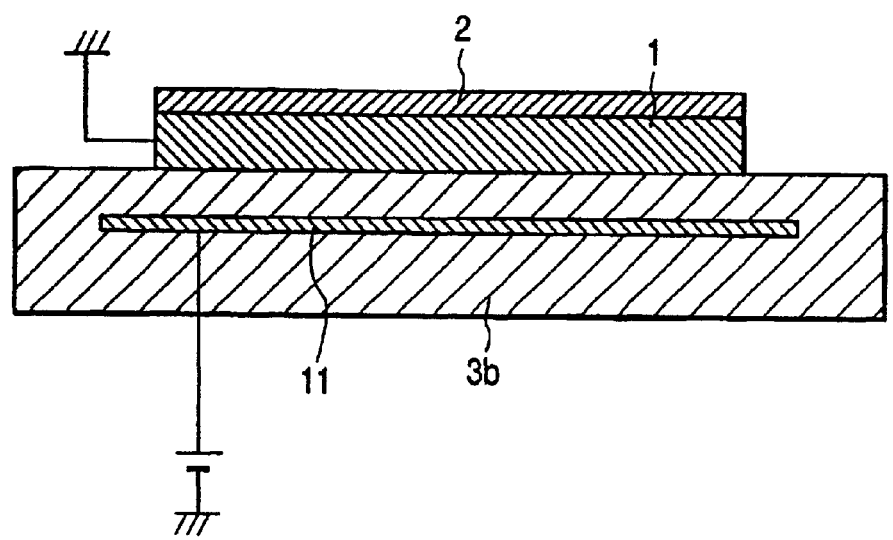
FIG. 5 is a schematic, sectional view to show an example of the substrate holding method by electrostatic suction.

Next described is an example of the holding (securing) of the substrate by electrostatic suction of a single electrode type. FIG. 5 is a schematic, sectional view to show a state in which the substrate 1 is held on the substrate support member 3b by electrostatic suction. In the same figure, the substrate support member 3b is made of an insulator such as alumina or the like and has an electrode 11 inside. For example, the substrate 1 is grounded and a dc power supply is placed between the electrode 11 and the earth. In this arrangement, the substrate 1 is held on the substrate support member 3b by a potential difference placed between the electrode 11 and the substrate 1.

Figure 6:
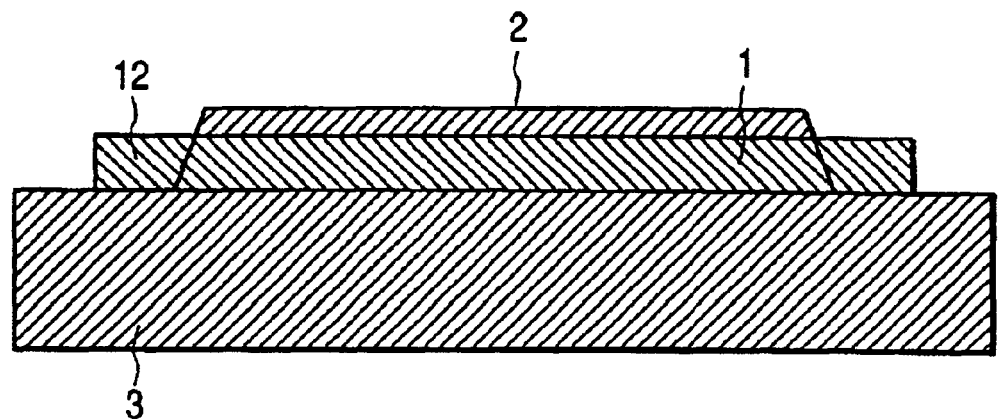
FIG. 6 is a schematic, sectional view to show an example of the substrate holding method by the securing claw.
Figure 7:
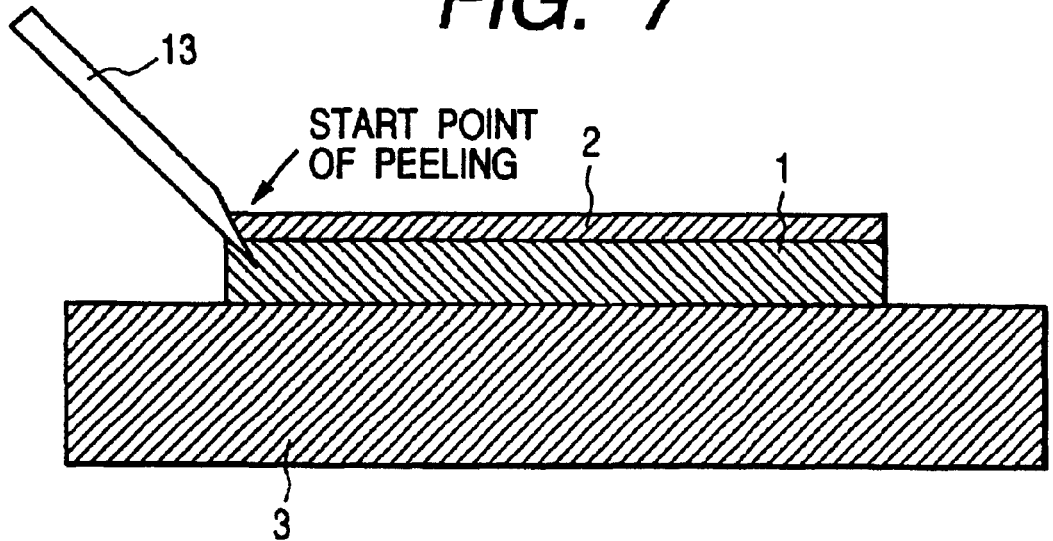
FIG. 7 is a schematic, sectional view to show an example of the substrate holding method by the securing claw of a knife shape.

Next described is an example of the mechanical holding (securing) of the substrate by the securing claw. FIG. 6 is a schematic, sectional view to show a state in which the substrate 1 is secured by the securing claw 12 provided on the substrate holding member 3. For realizing this securing, for example, the periphery of the substrate is first cut obliquely to form a hold for the securing claw and the substrate 1 is held on the substrate holding member 3 by the securing claw 12. FIG. 7 shows a schematic, sectional view to show another example of the holding using the securing claw of another type. In this example, the securing claw 13 of a knife shape is stuck into the substrate 1 while breaking the semiconductor thin film 2 at the start point of peeling. On that occasion, the other peripheral portions do not have to be fixed as long as the substrate is held so as not to come up. This method has the advantage of capability of presenting an occasion of the peeling of the semiconductor thin film and also holding the substrate at the same time.

[Thin Film Support Member]

The thin film support member 5 can be used not only as a means for supporting the thin film during the peeling, but also as a pressing means for pressing the film 4 during the bonding of the film 4 to the semiconductor thin film 2. In this case, bubbles are prevented from remaining between the film 4 and the semiconductor thin film 2, so as to prevent decrease of the adhesive strength. In cases where heating is necessary for curing of the adhesive of the film 4, if a heating means is incorporated inside the thin film support member 5, the heating can be effected at the same time as the pressing of the film, which can improve work efficiency. The main body of the thin film support member 5 may be equipped with a holding/securing means for holding or securing the semiconductor thin film 2, instead of the use of the film 4 described above for the peeling of the semiconductor thin film 2. The holding/securing means can be either one selected from the vacuum suction, the electrostatic suction, the securing claw, etc., similar to those described above. When a metal sheet is used as the film 4, the metal sheet (film) 4 can be held by an electromagnet built in the thin film support member 5.

APPLICATION EXAMPLE 1 TO SOLAR CELL

Figure 8:
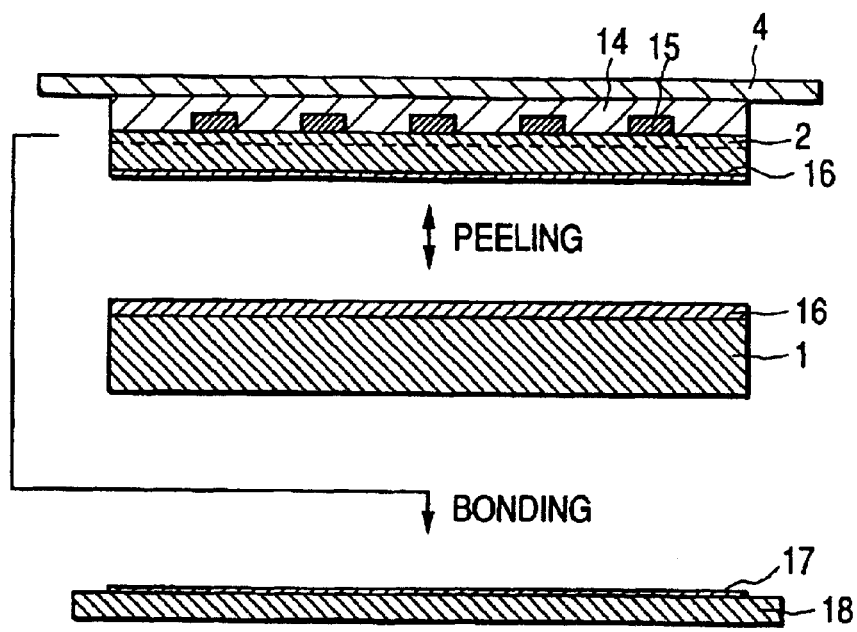
FIG. 8 is a schematic, sectional view for explaining an example of the method of producing the solar cell according to the present invention.

Next described referring to FIG. 8 is an application example of the method of producing semiconductor thin film according to the present invention to production of a solar cell. FIG. 8 is a schematic, sectional view for explaining a method of producing a solar cell according to the present invention.

The production method will be described in order. First, a porous layer 16 is formed in the surface of a $p^+$ single-crystal silicon substrate 1 by anodization thereof in a hydrofluoric acid solution, this porous layer 16 being used as a separation layer. The porous layer is subjected to hydrogen annealing to flatten the surface and thereafter a $p^-$ silicon layer is epitaxially grown thereon. Next, an $n^+$ silicon layer is epitaxially grown on this $p^-$ silicon layer or an n-type dopant is implanted or diffused into the $p^-$ silicon layer. This forms the semiconductor thin film 2 having a pn junction. Then an electroconductive paste is printed in a pattern on this semiconductor thin film 2 to form electrodes 15.

Then the light-transmitting film 4 is bonded through a light-transmitting adhesive 14. The light-transmitting adhesive 14 can be EVA formed in a sheet shape or the like. The light-transmitting film can be a fluororesin film made of the ethylene-tetrafluoroethylene copolymer (ETFE) or the like. After that, the semiconductor thin film 2 having the pn junction is peeled away from the substrate 1 by the method of the present invention as described above. On that occasion, the peeling takes place by breakage of the porous layer 16, or by separation at the interface between the porous layer 16 and the substrate 1 or at the interface between the porous layer 16 and the semiconductor thin film 2.

The semiconductor thin film (pn junction) 2, as peeled together with the light-transmitting film 4, is bonded through an electroconductive adhesive 17 to an electroconductive substrate 18 of an aluminum plate or the like, thus completing the solar cell. It is noted that the porous layer 16 remaining may be removed before the bonding. After the porous layer 16 remaining on the surface of the substrate 1 is removed by etching, polishing, or the like, the substrate 1 is again used as a substrate for growth of another semiconductor thin film.

In this example, the process may be modified as follows; after the epitaxial growth of the p⁻ silicon layer, the p⁻ silicon layer is peeled off by the method of the present invention, thereafter the pn junction is formed with the p⁻ silicon layer, and it is bonded to the conductive substrate. The separation layer can be a different material layer such as a graphite layer or the like, or a modified layer by implantation of hydrogen ions. In the present example the film 4 for the peeling can be utilized as one of components of the solar cell without having to be removed, which can simplify the production steps drastically.

APPLICATION EXAMPLE 2 TO SOLAR CELL

Figure 9:
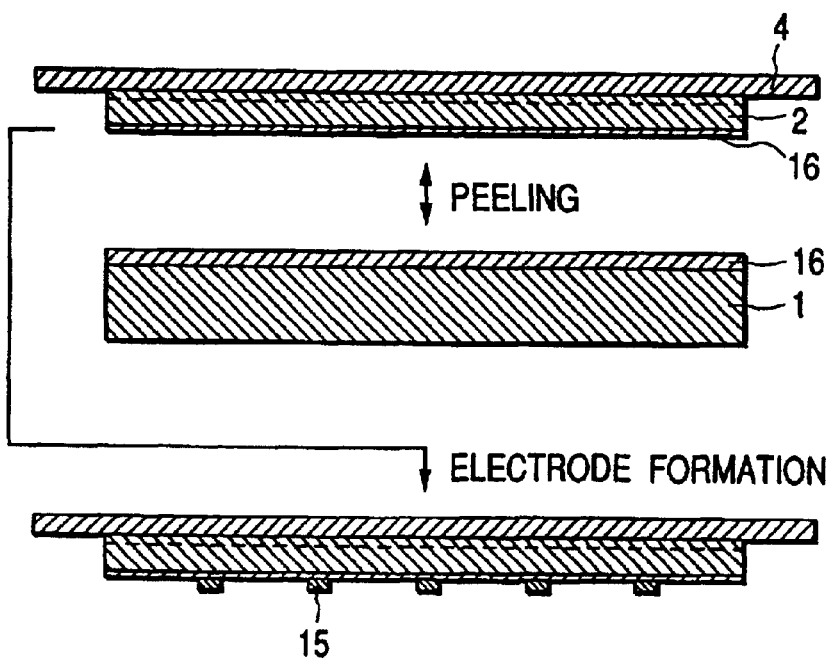
FIG. 9 is a schematic, sectional view for explaining another example of the method of producing the solar cell according to the present invention.

Next described referring to FIG. 9 is another application example of the method of producing semiconductor thin film according to the present invention to production of solar cell. FIG. 9 is a schematic, sectional view for explaining the application example to production of a solar cell using an opaque material for the film 4. In the present example, the p⁺ single-crystal silicon substrate 1 is first anodized to form the porous layer 16 and then it is subjected to hydrogen annealing. After that, the n⁺ silicon layer and p⁻ silicon layer are epitaxially grown thereon. Then a p⁺ silicon layer is formed by epitaxial growth or by diffusion of a p-type dopant from the surface of the p⁻ silicon layer. Then a film electrically conductive at least in the surface, i.e., electroconductive film 4 is bonded to the surface. The electroconductive film 4 can be one obtained by sputtering or evaporating a metal such as aluminum or the like on a resin film, or a thin film of a metal such as aluminum or the like. Preferred methods for bonding these films 4 to the semiconductor thin film (pn junction) 2 include bonding with an electroconductive adhesive, compression bonding under heat (thermal fusion), and so on.

Then the electrodes 15 are formed on the surface of the semiconductor thin film (pn junction) 2 as peeled together with the conductive film 4. The remaining porous layer 16 may be removed before the formation of electrodes, but the remaining porous layer 16 can also be utilized as a texture structure of the solar cell without being removed, because the side of the remaining porous layer 16 is a light incident surface in the present example.

According to the present invention, in the method of producing the semiconductor thin film having the step of peeling the semiconductor thin film formed on the substrate away from the substrate, the semiconductor thin film can be peeled away from the substrate without damage. Further, since the substrate can be held without contamination, the productivity can be enhanced in recycling of the substrate. Moreover, when the method of producing the semiconductor thin film of the present invention is applied to the production of solar cell, the solar cell with flexibility can be produced through the simple steps.

What is claimed is:

1. A method of producing a solar cell, comprising:

the step of forming a separation layer on a substrate and forming a semiconductor thin film having a semiconductor layer of a first conductivity type and a semiconductor layer of a second conductivity type on the separation layer;

the step of bonding a light-transmitting flexible film onto the semiconductor thin film with a light-transmitting adhesive;

the step of securing an edge of the flexible film extending outwardly from the substrate to a thin film support member having a curved surface;

the step of rotating the thin film support member while the flexible film is kept in contact with the curved surface of the thin film support member, thereby peeling the semiconductor thin film away from the substrate; and the step of forming an electrode on a back surface of the semiconductor thin film thus peeled.

2. A method of producing a solar cell, comprising:

the step of forming a separation layer on a substrate and forming a semiconductor thin film of a first conductivity type on the separation layer;

the step of bonding a light-transmitting flexible film onto the semiconductor thin film of the first conductivity type with a light-transmitting adhesive;

the step of securing an edge of the flexible film extending outwardly from the substrate to a thin film support member having a curved surface;

the step of rotating the thin film support member while the flexible film is kept in contact with the curved surface of the thin film support member, thereby peeling the semiconductor thin film of the first conductivity type away from the substrate;

the step of forming a semiconductor thin film of a second conductivity type on a back surface of the first semiconductor thin film thus peeled; and the step of forming an electrode on the semiconductor thin film of the second conductivity type.

3. A method of producing a solar cell, comprising:

the step of forming a separation layer on a substrate and forming a semiconductor thin film having a first semiconductor layer of a first conductivity type and a second semiconductor layer of a second conductivity type on the separation layer;

the step of bonding an electroconductive flexible film onto the semiconductor thin film with an electroconductive adhesive;

the step of securing an edge of the flexible film extending outwardly from the substrate to a thin film support member having a curved surface;

the step of rotating the thin film support member while the flexible film is kept in contact with the curved surface of the thin film support member, thereby peeling the semiconductor thin film away from the substrate; and the step of forming an electrode on a back surface of the semiconductor thin film thus peeled.

4. The method according to claim 3, wherein the peeling is carried out while holding the electroconductive film by an electromagnet.

5. A method of producing a solar cell, comprising:

the step of forming a separation layer on a substrate and forming a semiconductor thin film on the separation layer;

the step of bonding a flexible film onto the semiconductor thin film with an adhesive;

the step of securing an edge of the flexible film extending outwardly from the substrate to a thin film support member having a curved surface;

the step of rotating the thin film support member while the flexible film is kept in contact with the curved surface of the thin film support member, thereby peeling the semiconductor thin film away from the substrate; and the step of forming an electrode, or another semiconductor thin film and an electrode on a back surface of the semiconductor thin film thus peeled.

* * * * *